(12) United States Patent
Yun et al.

(10) Patent No.: US 12,515,295 B2
(45) Date of Patent: Jan. 6, 2026

(54) POLISHING PAD AND METHOD FOR PREPARING A SEMICONDUCTOR DEVICE USING THE SAME

(71) Applicant: ENPULSE CO., LTD., Chungcheongnam-Do (KR)

(72) Inventors: Jong Wook Yun, Gyeonggi-do (KR); Eun Sun Joeng, Gyeonggi-do (KR); Jangwon Seo, Gyeonggi-do (KR); Hyeyoung Heo, Gyeonggi-do (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 848 days.

(21) Appl. No.: 17/731,410

(22) Filed: Apr. 28, 2022

(65) Prior Publication Data
US 2022/0410337 A1      Dec. 29, 2022

(30) Foreign Application Priority Data
Jun. 2, 2021    (KR) .................. 10-2021-0071644

(51) Int. Cl.
*B24B 37/24*       (2012.01)
*H01L 21/3105*    (2006.01)

(52) U.S. Cl.
CPC ........ *B24B 37/24* (2013.01); *H01L 21/31053* (2013.01)

(58) Field of Classification Search
CPC .... B24B 37/24; C08G 18/10; C08G 18/3206; C08G 18/3243; C08G 18/48;
(Continued)

(56) References Cited

U.S. PATENT DOCUMENTS 9,484,212 B1    11/2016    Qian et al.
11,654,526 B2 *  5/2023    Miyasaka ............... B24B 37/24
                                                                428/423.1
(Continued)

FOREIGN PATENT DOCUMENTS

JP         H02194015 A    *  7/1990
KR    10-2003-0004421 A       1/2003
(Continued)

OTHER PUBLICATIONS

Songhan Plastic Technology Co., Expancel Microspheres Product Sheet (Year: 2016).*
(Continued)

*Primary Examiner* — Amber R Orlando
*Assistant Examiner* — Ryan Patrick Loughran
(74) *Attorney, Agent, or Firm* — IP & T GROUP LLP

(57) ABSTRACT

The present invention relates to a polishing pad for use in a chemical mechanical planarization (CMP) process of semiconductors, to a process for preparing the same, and to a process for preparing a semiconductor device using the same. The polishing pad according to an embodiment can achieve low hardness by comprising a polishing layer formed using a curing agent of specific components. It is possible to enhance the mechanical properties of the polishing pad, as well as to improve the surface defects appearing on the surface of a semiconductor substrate, by controlling the surface roughness reduction rate and the recovery elasticity index of the polishing pad to specific ranges. It is also possible to further enhance the polishing rate.

20 Claims, 4 Drawing Sheets

(58) Field of Classification Search
CPC ............ C08G 18/4854; C08G 18/5021; C08G 18/6674; C08G 18/6685; C08G 18/724; C08G 18/758; C08G 18/7621; C08G 2101/00; H01L 21/31053
See application file for complete search history.

(56) References Cited

U.S. PATENT DOCUMENTS

| | | | | |
|---|---|---|---|---|
| 2003/0139122 | A1* | 7/2003 | Lawing | B24B 37/20 451/288 |
| 2019/0168356 | A1 | 6/2019 | Qian et al. | |
| 2021/0138605 | A1 | 5/2021 | Heo et al. | |

FOREIGN PATENT DOCUMENTS

| | | | |
|---|---|---|---|
| KR | 10-2008-0037719 A | 4/2008 | |
| KR | 10-2237326 81 | 4/2021 | |
| KR | 10-2245260 B1 | 4/2021 | |
| WO | 01/91971 A1 | 12/2001 | |
| WO | 2007/024464 A1 | 3/2007 | |
| WO | WO-2019074098 A1 * | 4/2019 | ............. B24B 37/00 |

OTHER PUBLICATIONS

Machine translation of JP-H02194015, plus Structure 2 from the original Japanese version (Year: 1990).*
Sigma-Aldrich, Poly(1,4-butanediol)bis(4-aminobenzoate) Product Sheet (Year: 2012).*
PubChem, National Library of Medicine, NIH.gov, Substance ID: 135358173, Tetronic 701 Information (Year: 2012).*
Smith et al. "Effect of Molecular Structure on the Thermal Aging Properties of Flexible Urethane Foams" 1965, Special Report, The Bendix Corporation (Year: 1965).*
Lawing, 245th ECS Meeting, Abstract to Oral Presentation D01-1260 (Year: 2024).*
Stein et al. Journal of Electronic Materials 1996, 25(10) 1623-1627 (Year: 1996).*
Pureon/DuPont, IC-1000 Polishing Pads Specification Sheet (Year: 2024).*
Office Action for the Korean Patent Application No. 10-2021-0071644 issued by the Korean Patent Office on Jan. 18, 2023.
Office Action(Search Report, Written Opinion) for the Singaporean Patent Application No. 10202204371S issued by the Intellectual Property Office of Singapore on May 21, 2024.
Extended European Search Report for the European Patent Application No. 22176752.8 issued by the European Patent Office on Oct. 13, 2022.

* cited by examiner

[Fig. 1]
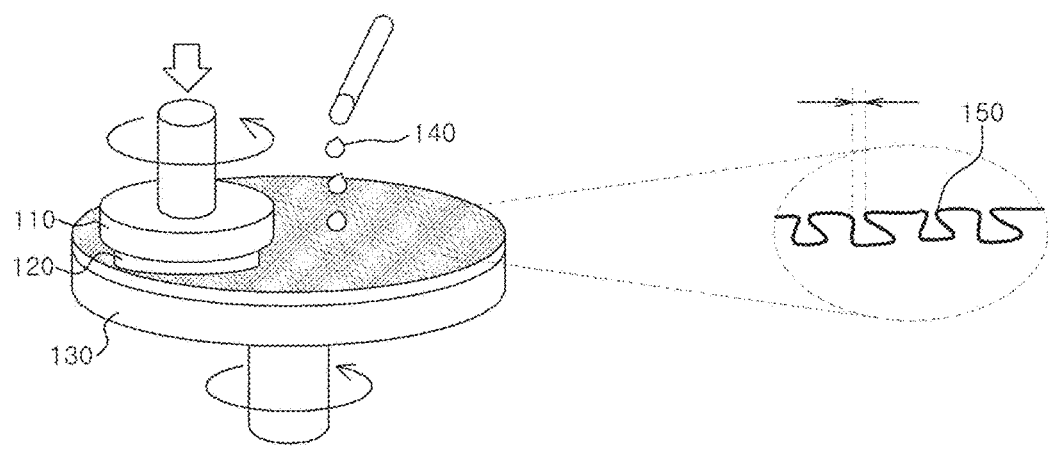
[Fig. 2]
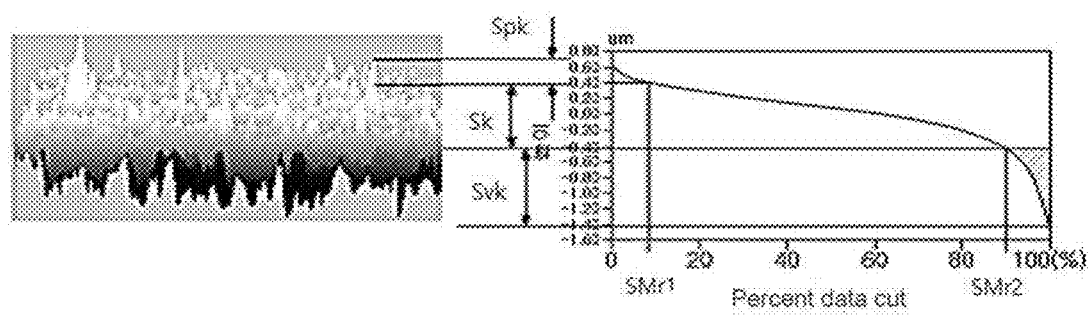

[Fig. 3]
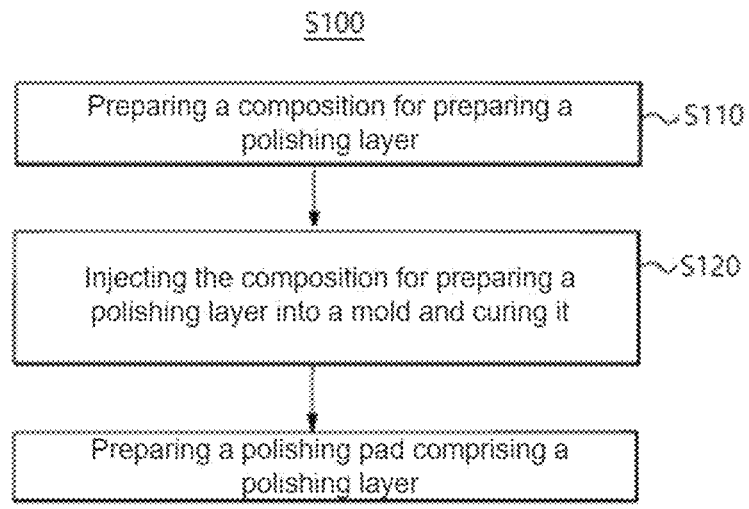
[Fig. 4]
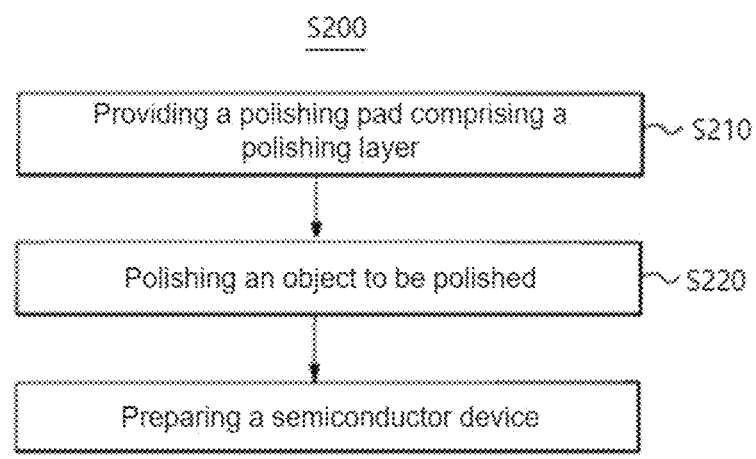

[Fig. 5]
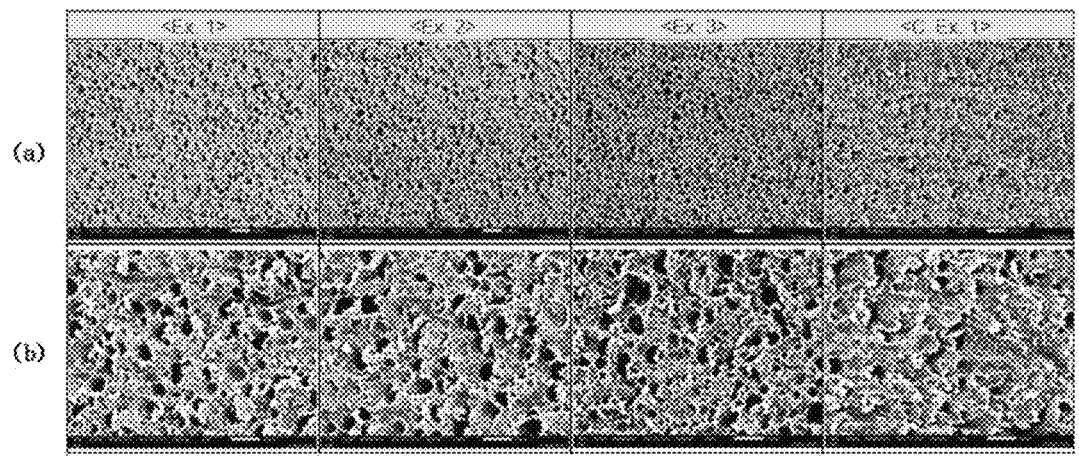
[Fig. 6]
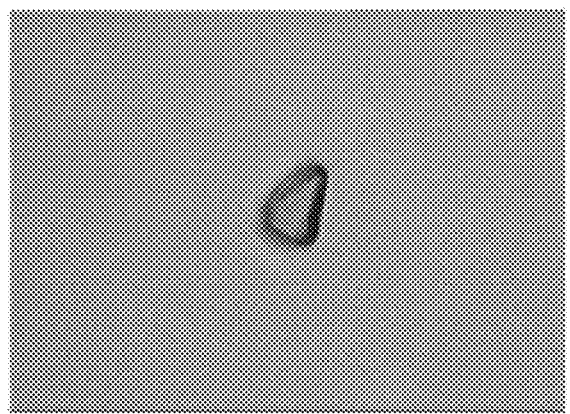

[Fig. 7]
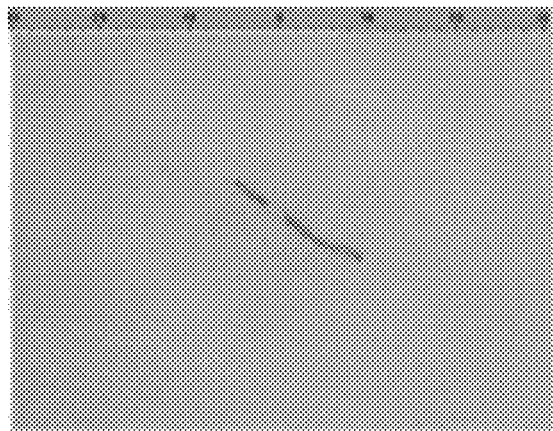
[Fig. 8]
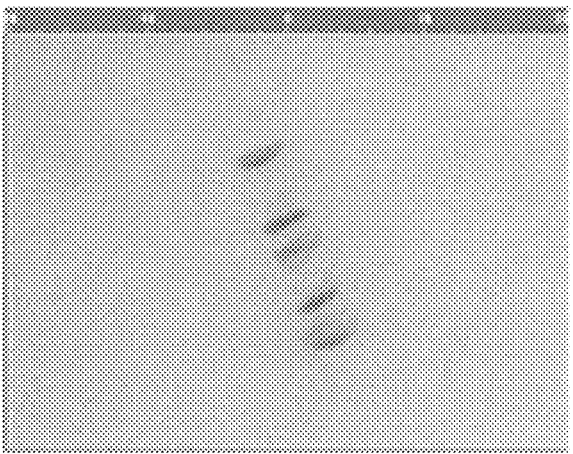

POLISHING PAD AND METHOD FOR PREPARING A SEMICONDUCTOR DEVICE USING THE SAME

CROSS-REFERENCE TO RELATED APPLICATION(S)

This application claims benefit of priority to Korean Patent Application No. 10-2021-0071644 filed on Jun. 2, 2021 in the Korean Intellectual Property Office, the disclosure of which is incorporated herein by reference in its entirety.

TECHNICAL FIELD

The present invention relates to a polishing pad and to a process for preparing a semiconductor device using the same.

BACKGROUND ART

A chemical mechanical planarization (CMP) or chemical mechanical polishing (CMP) process may be carried out for various purposes in various technical fields. The CMP process is carried out on a certain side of an object to be polished. It may be carried out for the purposes of planarization of the side to be polished, removal of aggregated materials, resolution of damage to the crystal lattice, and removal of scratches and contamination sources.

A polishing pad is an essential member that plays an important role in such a CMP process. In general, a polishing pad is composed of a polyurethane-based resin and has grooves on its surface for a large flow of a slurry and pores for supporting a fine flow thereof. The pores in a polishing pad among the above may be formed by using a solid phase foaming agent having voids, a gas phase foaming agent, or a liquid phase foaming agent, or by generating a gas by a chemical reaction.

Since the polishing layer directly interacts with the surface of a semiconductor substrate during the CMP process, it affects the processing quality of the surface of the semiconductor substrate. In particular, the thermal stability and polishing stability of the CMP process may be affected by the composition and physical properties of the polishing layer and the shape of pores.

Various studies have been conducted to solve this problem. For example, a method for enhancing the polishing rate and polishing stability by using 4,4'-methylenebis(2-chloroaniline) (MOCA) as a curing agent has been studied.

However, if MOCA is used as a curing agent, the hardness of the polishing pad is increased, which causes severe hardening thereof and an increase in the surface roughness reduction rate, resulting in pad glazing and poor polishing performance. There is also a problem in that surface defects such as residues, scratches, and chatter marks appearing on the surface of the semiconductor substrate are increased.

PRIOR ART DOCUMENT

Patent Document (Patent Document 1) Korean Laid-open Patent Publication No. 2008-0037719

DETAILED DESCRIPTION OF THE INVENTION

Technical Problem

The present invention aims to solve the above problems of the prior art.

An object of the present invention is to provide a polishing pad capable of achieving low hardness by comprising a polishing layer formed using a curing agent of specific components, capable of improving such surface defects as residues, scratches, and chatter marks appearing on the surface of a semiconductor substrate by controlling the surface roughness reduction rate and the recovery elasticity index of the polishing pad to specific ranges, and capable of further enhancing the polishing rate, and a process for preparing the same.

Another object of the present invention is to provide a process for preparing a useful semiconductor device on a film substance (semiconductor substrate) to be polished using the polishing pad.

Solution to the Problem

The present invention provides a polishing pad, which comprises a polishing layer, wherein the polishing layer comprises a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the following Equation 1 and a recovery elasticity resistance index (RERI) of 40 or less as represented by the following Equation 2:

$$RSk\ (\%) = \frac{Sk_1 - Sk_2}{Sk_1} \times 100 \quad \text{[Equation 1]}$$

In Equation 1, $Sk_1$ is the core roughness depth of the polishing pad before polishing, and $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute.

$Sk_1$ and $Sk_2$ are each a value calculated from data measured by an optical surface roughness meter for the polishing pad before polishing and the polishing pad after polishing in accordance with the ISO 25178-2 standard.

$$\text{Recovery elasticity resistance index}\ (RERI) = \frac{Rsk\ (\%)}{100\ (\%)} \times H_{25} \quad \text{[Equation 2]}$$

In Equation 2, RSk (%) is as defined in Equation 1 above, $H_{25}$ is the Shore D hardness of the polishing pad measured at 25° C., and the recovery elasticity resistance index (RERI) is a ratio between values excluding units.

In addition, the present invention provides a process for preparing a polishing pad, which comprises mixing a urethane-based prepolymer, a curing agent, and a foaming agent to prepare a composition for preparing a polishing layer; and injecting the composition for preparing a polishing layer into a mold and curing it to obtain a polishing pad comprising a polishing layer, wherein the curing agent comprises a tertiary amine-based polyol containing an ether bond, and the polishing pad has a surface roughness reduction rate (RSk (%)) of less than 50% as represented by the above Equation 1 and a recovery elasticity resistance index (RERI) of 40 or less as represented by the above Equation 2.

In addition, the present invention provides a process for preparing a semiconductor device, which comprises providing a polishing pad comprising a polishing layer; and relatively rotating the polishing surface of the polishing layer and the surface of an object to be polished while they are in contact with each other to polish the object to be polished, wherein the polishing pad comprises a polishing layer, the polishing layer comprises a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the above Equation 1 and a recovery elasticity resistance index (RERI) of 40 or less as represented by the above Equation 2.

Advantageous Effects of the Invention

The polishing pad according to the embodiment of the present invention can achieve low hardness by comprising a polishing layer formed using a curing agent of specific components. It is possible to enhance the mechanical properties of the polishing pad, as well as to improve the surface defects appearing on the surface of a semiconductor substrate, by controlling the surface roughness reduction rate and the recovery elasticity resistance index of the polishing pad to specific ranges. It is also possible to further enhance the polishing rate.

BRIEF DESCRIPTION OF THE DRAWINGS

FIG. 1 schematically illustrates a process for preparing a semiconductor device according to an embodiment.

FIG. 2 is a diagram illustrating surface roughness derived from an area material ratio curve based on the ISO 25178-2 standard when a polishing pad is measured with an optical surface roughness meter.

FIG. 3 illustrates a process for preparing a polishing pad according to an embodiment of the present invention.

FIG. 4 illustrates a process for preparing a semiconductor device according to an embodiment of the present invention.

FIG. 5 illustrates scanning electron microscope (SEM) photographs of the cross-sections of the polishing pads prepared in Examples 1 to 3 and Comparative Example 1 as analyzed at magnifications 100 and 300, respectively.

FIG. 6 is a photograph showing the shape of a residue on a wafer according to an embodiment.

FIG. 7 is a photograph showing the shape of a scratch on a wafer according to an embodiment.

FIG. 8 is a photograph showing the shape of a chatter mark on a wafer according to an embodiment.

BEST MODE FOR CARRYING OUT THE INVENTION

Hereinafter, the present invention will be described in detail.

Advantages and features of the present invention and methods for achieving the same will become apparent with reference to the following embodiments. However, the present invention is not limited to the embodiments disclosed below, and it will be implemented in a variety of different forms. These embodiments allow the disclosure of the present invention to be complete, and to fully inform a person of ordinary skill in the art to which the present invention pertains of the scope of the invention. The present invention is only defined by the scope of the claims.

In order to clearly express various layers and regions in the drawings, the thicknesses are enlarged. For the convenience of explanation, the thickness of some layers and regions is exaggerated in the drawings. The same reference numerals refer to the same elements throughout the present specification.

[Polishing Pad]

In an embodiment of the present invention, there is provided a polishing pad, which comprises a polishing layer, wherein the polishing layer comprises a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the following Equation 1 and a recovery elasticity resistance index (RERI) of 40 or less as represented by the following Equation 2:

$$RSk\ (\%) = \frac{Sk_1 - Sk_2}{Sk_1} \times 100 \quad \text{[Equation 1]}$$

In Equation 1, $Sk_1$ is the core roughness depth of the polishing pad before polishing, and $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute.

$Sk_1$ and $Sk_2$ are each a value calculated from data measured by an optical surface roughness meter for the polishing pad before polishing and the polishing pad after polishing in accordance with the ISO 25178-2 standard.

$$\text{Recovery elasticity resistance index } (RERI) = \frac{Rsk\ (\%)}{100\ (\%)} \times H_{25} \quad \text{[Equation 2]}$$

In Equation 2, RSk (%) is as defined in Equation 1 above, $H_{25}$ is the Shore D hardness of the polishing pad measured at 25° C., and the recovery elasticity resistance index (RERI) is a ratio between values excluding units.

The polishing process in a process for fabricating semiconductors is carried out in a way in which a polishing pad, a polishing slurry, and a film substance to be polished are closely associated. In general, it is carried out while a polishing slurry is supplied to the contact interface between the polishing pad and the film substance to be polished.

Since the polishing pad comprises a polishing layer comprising pores, and the polishing layer directly interacts with the surface of a semiconductor substrate during the CMP process, it affects the processing quality of the surface of the semiconductor substrate. In particular, mechanical properties such as hardness, tensile strength, and elongation vary depending on the components of the polishing layer, specifically, the composition of the prepolymer and the curing agent, which are the main raw materials of the polishing layer. In particular, hardness among these physical properties has a significant impact on not only the polishing rate, which is an important performance of the polishing pad, but also surface defects on the film substance to be polished. Further, the hardness also has an impact on the uniformity of the polishing removal rate.

Accordingly, it is very important to properly design the composition of the polishing layer and to control its physical properties within a desired range.

Specifically, during polishing, a polishing slurry is supplied onto the polishing pad between the polishing pad and the semiconductor substrate, and the chemical components in the polishing slurry react with the surface of the semiconductor substrate to form a reaction layer. The reaction layer is physically removed as the polishing head and the polishing pad are rotated with each other about their respective driving shafts; as a result, the polishing surface of the semiconductor substrate attached to the polishing head and the polishing pad are rubbed in close contact with each other.

Here, reactants, slurry particles, foreign substances, and the like on the semiconductor substrate are vitrified by high pressure and temperature and then adhered to the surface of the polishing pad, thereby causing a so-called glazing phenomenon. Thus, non-uniform surface deformation may take place due to the difference in relative motion distance between the polishing pad and the semiconductor substrate. In such a case, the polishing rate and surface roughness may be deteriorated, resulting in a problem in that such defects as residues, scratches, and chatter marks appearing on the film substance (semiconductor substrate) to be polished are increased.

In particular, if the glazing phenomenon takes place a lot, the area in contact with the polished surface of the semiconductor substrate increases, and the polishing particles of a slurry are interposed between the region where the glazing has taken place and the polished surface of the semiconductor substrate to agglomerate, thereby causing more defects.

Accordingly, an embodiment of the present invention is technically characterized in that the surface roughness reduction rate (RSk (%)) and the recovery elasticity resistance index (RERI) of the polishing pad are controlled to a specific range or less, whereby the glazing phenomenon and the generation rate of surface deformation of the polishing pad after polishing are lowered, thereby minimize the surface defects and the deterioration in the polishing performance.

In the present specification, the surface roughness reduction rate (RSk (%)) is a ratio of the difference in surface roughness of the polishing pad before and after polishing to the surface roughness of the polishing pad before polishing in a percentage (%). It is represented by the following Equation 1.

$$RSk\ (\%) = \frac{Sk_1 - Sk_2}{Sk_1} \times 100 \qquad \text{[Equation 1]}$$

In Equation 1, $Sk_1$ is the core roughness depth of the polishing pad before polishing, and $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute.

$Sk_1$ and $Sk_2$ are each a value calculated from data measured by an optical surface roughness meter for the polishing pad before polishing and the polishing pad after polishing in accordance with the ISO 25178-2 standard.

In the present specification, the surface roughness refers to a surface roughness of a polishing pad in which the surface of the polishing pad is formed by processing or polishing. The optical surface roughness meter used in the present invention is a Contour GT model manufactured by Bruker. For detailed conditions for measuring the surface roughness of a polishing pad, see the examples of the present specification.

If the surface roughness of the polishing pad is maintained constant before, during, and after the polishing, the glazing phenomenon is reduced, whereby the polishing rate is maintained to be constant, and surface defects appearing on the surface of the semiconductor substrate may be reduced.

As an example, referring to FIG. 1, the polishing pad is used in a CMP process, in which the surface shape of the polishing pad is deformed by the pressure applied in the vertical direction through the semiconductor substrate (or wafer) (120) attached to the head (110) and by the shear stress applied in the horizontal direction by the rotation of the platen (130) during the process.

The polishing pad is provided on its surface with grooves for a large flow of a slurry (140) and pores for supporting a fine flow thereof. In the polishing pad, the shape of not only the grooves on the surface but also pores (150) is deformed by external stress, which may cause a change in the surface roughness of the polishing pad.

In particular, a change in the shape of pores and the degree of pore coalescence that causes a change in the surface roughness of the polishing pad upon polishing may have an impact on the polishing rate, the planarization of a semiconductor substrate, and the residues, scratches, and chatter marks on the semiconductor substrate surface among the significant performance of a CMP process. Thus, their control is particularly important.

The surface roughness of the polishing pad upon polishing adjusted by these characteristics may vary depending on the type of a urethane-based prepolymer, a foaming agent, or a curing agent. In addition, the surface roughness may vary depending on the rotational speed of the mixing head when the respective components are mixed, the degree of grooving, preconditioning conditions, and the like. In addition, the surface roughness may be controlled by various variables.

The surface roughness reduction rate (RSk (%)) of the polishing pad according to an embodiment of the present invention is a ratio of the difference ($Sk_1-Sk_2$) in core roughness depth of the polishing pad before ($Sk_1$) and after ($Sk_2$) polishing to the core roughness depth of the polishing pad before polishing in a percentage (%). The surface roughness reduction rate RSk (%) may be, for example, less than 50%, for example, 48% or less, for example, 47% or less, for example, 45% or less, for example, 43% or less, for example, 42% or less, for example, 41% or less, for example, 38% or less, or, for example, 35% or less. Specifically, the surface roughness reduction rate RSk (%) may be, for example, 5% to less than 50%, for example, 10% to 48%, for example, 15% to 48%, for example, 20% to 48%, for example, 25% to 48%, for example, 30% to 48%, for example, 32% to 48%, for example, 34% to 47%, for example, 34% to 45%, for example, 34% to 42%, for example, 34% to 40%, or for example, 34% to 38%.

As the surface roughness reduction rate RSk (%) of the polishing pad according to an embodiment of the present invention is adjusted to less than 50%, the glazing phenomenon is reduced, whereby the polishing rate and surface defect characteristics appearing on the surface of the semiconductor substrate may be improved. If the surface roughness reduction rate (RSk (%)) is 50% or more, the irregular surface deformation of the polishing pad due to the glazing phenomenon is increased. As a result, the polishing rate, within-wafer non-uniformity, surface roughness, and the like may be deteriorated, and defects on the film substance to be polished may be increased.

The surface roughness reduction rate (RSk (%)) represented by Equation 1 may be calculated by measuring the core roughness depth of the polishing pad before and after polishing, respectively, and putting the values into Equation 1.

The surface roughness of the polishing pad, for example, the core roughness depth of the polishing pad may be obtained from an area material ratio curve measured with an optical surface roughness meter. The area material ratio curve is called a bearing area curve (BAC) or an Abbott-Firestone curve. It is a graph in which accumulated data according to the height measured for a unit area with a surface roughness measuring device are plotted.

Referring to FIG. 2, the parameters derived from the area material ratio curve of surface roughness are S parameters, which are parameters converted to depth (height), specifically, Spk, Svk, and Sk.

Spk is a reduced peak height, which provides an initial contact area when the polishing pad comes into contact with the surface of a semiconductor substrate during the CMP process; thus, it refers to a surface composed of high peaks that provide a high contact stress area (force/area). Spk may refer to the nominal height of a material that can be removed during operation.

Sk is a core roughness depth, which refers to the core roughness of the surface on which the load can be distributed after the surface is worn.

Svk is a reduced valley depth, which is a value obtained by measuring the depth of the valleys under the core roughness of the surface and is related to the slurry-carrying capability or the trapping capability of polishing pad debris.

Meanwhile, in FIG. 2, SMr1 is a peak material portion, which refers to a ratio of the material constituting the peak structure related to Spk.

In addition, SMr2 is a valley material portion, which refers to a percentage (100%−SMr2) of the measurement area constituting the deeper valley structure related to Svk.

In particular, the polishing pad according to an embodiment of the present invention is characterized in that the surface roughness reduction rate (RSk (%)) using the core roughness depth (Sk) of the polishing pad among the S parameters is controlled. That is, in the polishing pad, the reduction rate of the core roughness of the surface on which a load can be distributed after the surface is worn upon polishing as compared with that before polishing is controlled to less than 50%; thus, it is possible to enhance the polishing performance and to minimize the surface defects of the semiconductor substrate.

$Sk_1$ is the core roughness depth (μm) of the polishing pad before polishing. It may be 10 to 40, 10 to 35, 10 to 30, 15 to 30, 18 to 30, or 20 to 30. If $Sk_1$ satisfies the above range, the polishing performance may be more excellent.

$Sk_2$ is the core roughness depth (μm) of the polishing pad after polishing. It may be 3 to 30, 5 to 25, 9 to 25, 9 to 20, 10 to 18, or 12 to 17. If $Sk_2$ satisfies the above range, it is more advantageous for achieving excellent polishing performance and low surface defect characteristics by lowering the surface roughness reduction rate (RSk (%)) of the polishing pad. Here, the polishing may be carried out such that a silicon oxide layer of a semiconductor substrate is polished for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute. $Sk_2$ is the core roughness depth of the polishing pad measured after polishing under the above conditions.

The difference ($Sk_1$−$Sk_2$) (μm) between $Sk_1$ and $Sk_2$ may be 15 or less, 13 or less, 12 or less, 11 or less, 10 or less, or 9 or less. Specifically, the difference ($Sk_1$−$Sk_2$) (μm) between $Sk_1$ and $Sk_2$ may be 5 to 15, 7 to 13, 7 to 12, or 8 to 12. If the difference ($Sk_1$−$Sk_2$) between $Sk_1$ and $Sk_2$ satisfies the above range, it is possible to achieve excellent polishing performance and low surface defect characteristics by lowering the surface roughness reduction rate (RSk (%)) of the polishing pad.

Meanwhile, the recovery elasticity resistance index (RERI) quantifies the degree to which the property of returning to the original state is obstructed by elasticity after polishing. It may vary depending on the surface roughness reduction rate (RSk (%)) and hardness of the polishing pad.

The recovery elasticity resistance index (RERI) may be represented by the following Equation 2, and the recovery elasticity resistance index (RERI) is 40 or less:

$$\text{Recovery elasticity resistance index } (RERI) = \frac{Rsk\,(\%)}{100\,(\%)} \times H_{25} \quad \text{[Equation 2]}$$

In Equation 2, RSk (%) is as defined in Equation 1 above, $H_{25}$ is the Shore D hardness of the polishing pad measured at 25° C., and the recovery elasticity resistance index (RERI) is a ratio between values excluding units.

Specifically, according to an embodiment of the present invention, the recovery elasticity resistance index (RERI) may be controlled to 40 or less as a low surface roughness reduction rate (RSk (%)) and low hardness are achieved. That is, the recovery elasticity resistance index (RERI) is lower as the surface roughness reduction rate (RSk (%)) and hardness of the polishing pad are lower. It is higher as the surface roughness reduction rate (RSk (%)) and hardness of the polishing pad are higher. For example, if the surface roughness reduction rate (RSK (%)) of the polishing pad is low and the difference between the surface roughness of the polishing pad after polishing and the surface roughness of the polishing pad before polishing is small, the recovery elasticity resistance index (RERI) may be reduced. In such a case, even if the protrusions of the surface roughness are tilted by the polishing process, the protrusions may return to their original standing state due to elasticity attributable to the low hardness of the polishing pad. As a result, it may cause fewer surface defects such as residues, scratches, and chatter marks appearing on the surface of the semiconductor substrate. Accordingly, the lower the recovery elasticity resistance index (RERI), the fewer the surface defects appearing on the surface of the semiconductor substrate.

The recovery elasticity resistance index (RERI) may specifically be, for example, 38 or less, for example, 35 or less, for example, 32 or less, for example, 30 or less, for example, 25 or less, for example, 23 or less, or, for example, 20 or less. As the recovery elasticity resistance index (RERI) satisfies the above range, the defects appearing on the surface of the semiconductor substrate may be reduced.

Meanwhile, the polishing pad according to an embodiment of the present invention may have low hardness.

Specifically, the polishing pad may have a surface hardness at 25° C. of 40 Shore D to 60 Shore D, 40 Shore D to 55 Shore D, 40 Shore D to 52 Shore D, 40 Shore D to 50 Shore D, or 42 Shore D to 48 Shore D. If the polishing pad has a surface hardness at 25° C. satisfying the above range, it may be more advantageous for controlling the recovery elasticity resistance index (RERI) to 40 or less as desired in an embodiment of the present invention, whereby it is possible to minimize the defects appearing on the surface of the semiconductor substrate.

The polishing pad according to an embodiment of the present invention may have a tensile strength of 10 N/mm² to 100 N/mm², 15 N/mm² to 70 N/mm², 15 N/mm² to 50 N/mm², or 15 N/mm² to 40 N/mm². In addition, the polishing pad according to an embodiment of the present invention may have low tensile strength. For example, the polishing pad may have a tensile strength of 10 N/mm² to 25 N/mm², 15 N/mm² to 25 N/mm², or 16 N/mm² to 25 N/mm².

The polishing pad according to an embodiment of the present invention may have an elongation of 30% to 320% or 50% to 320%. In addition, the polishing pad according to an embodiment of the present invention may have high elongation. For example, the polishing pad may have an elongation of 80% to 320%, 90% to 320%, 100% to 320%, 150% to 320%, 200% to 320%, or 220% to 320%.

The polishing pad according to an embodiment of the present invention may have a specific gravity of 0.6 g/cm³ to 0.9 g/cm³. More specifically, the polishing pad may have a specific gravity of 0.7 g/cm³ to 0.85 g/cm³, but it is not limited thereto.

The polishing pad according to an embodiment of the present invention may have a surface hardness at 25° C. of 40 shore D to 60 shore D, a tensile strength of 10 N/mm² to 25 N/mm², and an elongation of 80% to 320%.

Meanwhile, the polishing pad comprises a plurality of pores.

In the polishing pad according to an embodiment of the present invention, the average diameter of the plurality of pores may be 5 μm to 200 μm. In addition, the average diameter of the plurality of pores may be 7 m to 100 μm, 10 μm to 60 μm, 10 μm to 50 μm, 10 μm to 32 μm, or 20 μm to 32 μm. The average diameter of the plurality of pores was calculated as a number average value of the pore diameters. For example, the polishing pad was observed with a scanning electron microscope (SEM) at a magnification of 200 times. The diameter of each pore was measured from an image obtained using an image analysis software, from which the average diameter ($D_a$) was calculated. The average diameter was defined as an average value obtained by dividing the sum of the diameters of the plurality of pores by the number of the pores in 1 mm² of the polishing surface.

The pores include closed pores disposed inside the polishing pad and open pores disposed on the polishing surface of the polishing pad.

Specifically, in the open pores, the pore inlet is exposed on the polishing surface.

Here, the diameter of the inlet of an open pore may refer to a diameter of a circle having the same planar area as that of the inlet of the open pore. In addition, the average diameter of the inlets of open pores may be calculated by number-averaging the diameters of the inlets of the plurality of open pores present on the polishing surface.

The total number of pores may be 700 or more per unit area (mm²) of the polishing pad. More specifically, the total number of pores may be 750 or more per unit area (mm²) of the polishing pad. Even more specifically, the total number of pores may be 800 or more per unit area (mm²) of the polishing pad. Even more specifically, the total number of pores may be 900 or more per unit area (mm²) of the polishing pad. But it is not limited thereto. In addition, the total number of pores may be 2,500 or less, specifically 2,200 or less, 1,500 or less, or 1,200 or less, per unit area (mm²) of the polishing pad, but it is not limited thereto. Thus, the total number of pores may be 700 to 2,500, for example, 750 to 2,200, 800 to 1,500, or 800 to 1,200, per unit area (mm²) of the polishing pad, but it is not limited thereto.

Specifically, the polishing pad may have an elastic modulus of 60 kgf/cm² or more. More specifically, the polishing pad may have an elastic modulus of 100 kgf/cm² or more, but it is not limited thereto. The upper limit of the elastic modulus of the polishing pad may be 150 kgf/cm², but it is not limited thereto.

The polishing pad according to an embodiment of the present invention may have a thickness of 1 mm to 10 mm. Specifically, the polishing pad may have a thickness of 1 mm to 9 mm, 1 mm to 8.5 mm, 1.5 mm to 10 mm, 1.5 mm to 9 mm, 1.5 mm to 8.5 mm, 1.8 mm to 10 mm, 1.8 mm to 9 mm, or 1.8 mm to 8.5 mm.

In addition, the polishing pad may have a thickness of 1 mm to 5 mm. Specifically, the polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm. If the thickness of the polishing pad is within the above range, the basic physical properties of the polishing pad may be sufficiently exhibited.

As described above, as the surface roughness reduction rate (RSk (%)) and recovery elasticity resistance index (RERI) are controlled to specific ranges or lower in the polishing pad according to an embodiment, it is possible to enhance the polishing rate and to reduce the surface defects appearing on the surface of the semiconductor substrate.

Meanwhile, when a semiconductor substrate comprising a silicon oxide layer is polished using a calcined ceria slurry, the polishing pad may have a polishing rate for an oxide layer of 1,600 Å/minute to 3,300 Å/minute, 1,600 Å/minute to 3,000 Å/minute, 1,600 Å/minute to 2,500 Å/minute, or 1,600 Å/minute to 2,200 Å/minute. If the polishing rate for an oxide layer is within the above range, it is advantageous for suppressing the pad glazing phenomenon, thereby maintaining an appropriate level of excellent polishing rate in the subsequent polishing processes repeatedly carried out.

In addition, the number of surface defects appearing on the surface of a semiconductor substrate (wafer) measured using a defect inspection device (AIT XP+, KLA Tencor) after a silicon oxide layer has been polished under the above conditions may be 20 or less. Here, the number of surface defects may refer to the total of residues, scratches, and chatter marks appearing on the surface of the semiconductor substrate.

The residue refers to a substantially amorphous foreign matter that adheres to the surface of a semiconductor substrate. For example, it refers to a defect of the shape as shown in FIG. 6.

The scratch refers to a substantially continuous linear scratch. For example, it refers to a defect of the shape as shown in FIG. 7.

Meanwhile, the chatter mark refers to a substantially discontinuous linear scratch. For example, it refers to a defect of the shape as shown in FIG. 8.

The number of surface defects appearing on the surface of a semiconductor substrate may be 15 or less, 10 or less, 8 or less, 7 or less, 5 or less, or 3 or less.

Meanwhile, the polishing pad may have grooves on its surface for mechanical polishing. The grooves may have a depth, a width, and a spacing as desired for mechanical polishing, which are not particularly limited.

The polishing pad according to an embodiment may simultaneously have the physical properties of the polishing pad as described above.

Meanwhile, the polishing pad according to an embodiment of the present invention comprises a polishing layer, and the polishing layer comprises a cured product of a composition comprising a urethane-based prepolymer, a curing agent, and a foaming agent.

According to an embodiment of the present invention, the surface roughness reduction rate (RSk (%)) and the recovery elasticity resistance index (RERI) of the polishing pad may vary depending on the composition for forming a cured product. Specifically, the surface roughness reduction rate (RSk (%)) and the recovery elasticity resistance index (RERI) of the polishing pad may vary depending on the urethane-based prepolymer, curing agent, and foaming agent. In addition, the surface roughness reduction rate (RSk (%)) and the recovery elasticity resistance index (RERI) of the polishing pad may vary depending on the purification of the raw materials of each component, the rotational speed of the mixing head when the respective components are mixed, the degree of grooving, preconditioning conditions, and the like. In addition, the above characteristics may be controlled by various variables.

Each component contained in the composition will be described below in detail.

According to an embodiment of the present invention, the curing agent employed in the composition for forming a polishing layer comprises a tertiary amine-based polyol containing an ether bond.

As a tertiary amine-based polyol containing an ether bond is used as a curing agent in an embodiment of the present invention, it may chemically react with the urethane-based prepolymer to form a final cured structure in the polishing layer, and it is possible to achieve the characteristics of the polishing pad as desired in the present invention.

Specifically, as a tertiary amine-based polyol of the specific component is employed in the composition for forming a polishing layer, it is possible to obtain a polishing pad having low hardness and to control the surface roughness reduction rate (RSk (%)) and the recovery elasticity resistance index (RERI) of the polishing pad to the ranges desired in the present invention.

The curing agent may comprise, for example, a compound represented by the following formula.

[Formula]

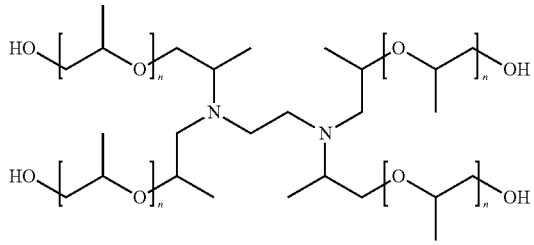

In the above formula, n is an integer of 1 to 10. n may be, for example, 1 to 9, for example, 1 to 8, for example, 1 to 7, or, for example, 1 to 6.

The curing agent may comprise, for example, a methyl-oxirane-containing 1,2-ethanediamine polymer compound, for example, a trade name of LA-480.

The tertiary amine-based polyol may have a weight average molecular weight (Mw) of 400 to 3,000 g/mole. Specifically, the weight average molecular weight of the tertiary amine-based polyol may be, for example, 400 to 2,700 g/mole, for example, 400 to 2,500 g/mole, for example, 400 to 2,490 g/mole, for example, 400 to 2,450 g/mole, for example, 400 to 2,400 g/mole, for example, 400 to 2,000 g/mole, for example, 400 to 1,800 g/mole, for example, 400 to 1,500 g/mole, for example, 400 to 1,300 g/mole, or, for example, 400 to 1,000 g/mole. If the tertiary amine-based polyol has a weight average molecular weight satisfying the above range, an appropriate gelation time may be secured when curing, a polishing pad having low hardness may be obtained, and it may be more advantageous for controlling the surface roughness reduction rate (RSk (%)) and the recovery elasticity resistance index (RERI) to specific ranges as desired in the present invention.

If the weight average molecular weight of the tertiary amine-based polyol is too small, the gelation time may be shortened. Here, the composition for forming a polishing layer takes a certain time to gelate by curing, which is referred to as gelation time. The gelation time of the composition may be at least 50 seconds, at least 70 seconds, at least 80 seconds, or at least 100 seconds. In addition, the gelation time of the composition may be at least 50 seconds, at least 70 seconds, at least 80 seconds, or at least 100 seconds. For example, the gelation time of the composition may be 50 seconds to 200 seconds, 50 seconds to 150 seconds, 50 seconds to 100 seconds, 100 seconds to 200 seconds, or 150 seconds to 200 seconds. As a specific example, the composition may have a gelation time of 80 seconds to 120 seconds. The gelation time may be, for example, a value measured at 70° C.

According to an embodiment of the present invention, the curing agent may further comprise an aromatic amine compound. That is, the curing agent may comprise a mixture of the tertiary amine-based polyol and an aromatic amine compound.

The aromatic amine compound may comprise at least one selected from the group consisting of diethyltoluenediamine; 3,5-dimethylthio-2,4-toluene diamine; 3,5-diethyltoluene-2,4-diamine; N,N'-bis-(sec-butylamino)-diphenylmethane; 4,4'-methylene-bis-(3-chloro-2,6-diethylaniline); polytetramethyleneoxide-di-p-aminobenzoate; N,N'-dialkyldiamino diphenyl methane; p,p'-methylene dianiline; m-phenylenediamine; 4,4'-methylene-bis-(2,6-diethylaniline); 4,4'-methylene-bis-(2,3-dichloroaniline); 4,4'-diamino-3,3'-diethyl-5,5'-dimethyl diphenylmethane; 2,2',3,3'-tetrachlorodiamino diphenylmethane; trimethylene glycol di-p-aminobenzoate; 3,5-diamino-4-chloro benzoic acid-2-methylpropyl ester; bis(4-amino-2-chloro-3,5-diethylphenyl)methane; propanediol bis-p-aminobenzoate; butyl diaminochlorobenzoate; methylene bis-methylanthranilate; chloro diethyltoluenediamine; methylene bis-o-ethylaniline; and isomers thereof.

Specifically, the aromatic amine compound may comprise at least one selected from the group consisting of N,N'-bis-(sec-butylamino)-diphenylmethane; 3,5-diamino-4-chloro benzoic acid-2-methylpropyl ester; bis(4-amino-2-chloro-3,5-diethylphenyl)methane; propanediol bis-p-aminobenzoate; butyl diaminochlorobenzoate; methylene bis-methylanthranilate; chloro diethyltoluenediamine; methylene bis-o-ethylaniline; and isomers thereof.

The aromatic amine compound may comprise a secondary amine compound.

The aromatic amine compound may have a weight average molecular weight (Mw) of 450 to 600 g/mole, for example, 450 to 580 g/mole or 450 to 550 g/mole.

If the tertiary amine-based polyol and the aromatic amine compound are used together, a polishing pad having low hardness may be obtained, and it may be advantageous for controlling the surface roughness reduction rate (RSk (%)) and the recovery elasticity resistance index (RERI) to specific ranges as desired in the present invention.

However, the mixing weight ratio of the tertiary amine-based polyol and the aromatic amine compound may be a very important factor in controlling the mechanical properties and polishing performance of a polishing pad and controlling the surface defect characteristics of a semiconductor substrate.

Specifically, the content of the tertiary amine-based polyol may be the same as, or greater than, the content of the aromatic amine compound by weight.

For example, the content of the tertiary amine-based polyol may be greater than the content of the aromatic amine compound by weight. If the content of the tertiary amine-based polyol is the same as, or greater than, the content of the aromatic amine compound, it is possible to prevent a decrease in the core roughness depth ($Sk_2$) of the polishing pad measured after polishing, which is more advantageous for achieving the effect. That is, as the content of the tertiary amine-based polyol is increased, the shape of the polishing pad may be well maintained even after polishing, and the surface roughness reduction rate (RSk (%)) of the polishing pad may be readily controlled.

In addition, if a mixture of the tertiary amine-based polyol and the aromatic amine compound is used as the curing agent according to an embodiment of the present invention, an isocyanate (NCO) group at the end of the urethane-based prepolymer reacts with a hydroxyl (OH) group of the tertiary amine-based polyol to form a urethane bond, and an isocyanate (NCO) group at the end of the urethane-based prepolymer may react with an amine (NH) group of the aromatic amine compound to form a urea bond. In such an event, the reaction rate of the urethane bond may be faster than that of the urea bond. That is, since the tertiary amine-based polyol can act as a catalyst, the reaction rate may be faster. In particular, since the unshared electron pair of the tertiary amine in the tertiary amine-based polyol strongly pulls electrons, it may accelerate the reaction.

In addition, as the content of the tertiary amine-based polyol is increased, the urethane bond is more actively formed, which may enhance the polishing characteristics upon conditioning. If the content of the aromatic amine compound is further increased, in the process of preparing a polishing layer by curing the composition for preparing a polishing layer, curing is not well carried out, thereby causing a problem.

According to an embodiment of the present invention, the mixing weight ratio of the tertiary amine-based polyol and the aromatic amine compound may be, for example, 5:5 to 9:1, for example, 5:5 to 8:2, for example, 6:4 to 9:1, for example, 6:4 to 8:2; or, for example, 7:3 to 8:2.

Meanwhile, the content of the curing agent may be about 18 parts by weight to about 27 parts by weight, for example, about 19 parts by weight to about 26 parts by weight, for example, about 20 parts by weight to about 26 parts by weight, based on 100 parts by weight of the urethane-based prepolymer. If the content of the curing agent satisfies the above range, it may be more advantageous for achieving desired surface characteristics of the polishing pad, specifically, surface roughness reduction rate (RSk (%)) and recovery elasticity resistance index (RERI).

In an embodiment, the curing agent may not comprise 4,4'-methylenebis(2-chloroaniline) (MOCA). If the curing agent comprises 4,4'-methylenebis(2-chloroaniline), the hardness increases, so that it may be difficult to achieve the desired effect in the present invention.

According to an embodiment of the present invention, the composition for forming a polishing layer comprises a urethane-based prepolymer.

A prepolymer generally refers to a polymer having a relatively low molecular weight wherein the degree of polymerization is adjusted to an intermediate level so as to conveniently mold a molded article in the process of producing a cured product. A prepolymer may be molded to a final cured product by itself or after a reaction with another polymerizable compound.

In an embodiment, the urethane-based prepolymer may be prepared by reacting an isocyanate compound with a polyol.

The isocyanate compound used in the preparation of the urethane-based prepolymer may be one selected from the group consisting of an aromatic diisocyanate, an aliphatic diisocyanate, an alicyclic diisocyanate, or combinations thereof.

The isocyanate compound, for example, may comprise one selected from the group consisting of 2,4-toluene diisocyanate (2,4-TDI), 2,6-toluene diisocyanate (2,6-TDI), naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, isophorone diisocyanate, and combinations thereof.

The polyol is a compound containing at least two or more hydroxyl groups (—OH) per molecule. For example, it may comprise one selected from the group consisting of a polyether polyol, a polyester polyol, a polycarbonate polyol, an acryl polyol, and combinations thereof.

The polyol, for example, may comprise one selected from the group consisting of polytetramethylene ether glycol, polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and combinations thereof.

The polyol may have a weight average molecular weight (Mw) of about 100 g/mole to about 3,000 g/mole. The polyol, for example, may have a weight average molecular weight (Mw) of about 100 g/mole to about 3,000 g/mole, for example, about 100 g/mole to about 2,000 g/mole, for example, about 100 g/mole to about 1,800 g/mole.

In an embodiment, the polyol may comprise a low molecular weight polyol having a weight average molecular weight (Mw) of about 100 g/mole to less than about 300 g/mole and a high molecular weight polyol having a weight average molecular weight (Mw) of about 300 g/mole to about 1,800 g/mole.

The urethane-based prepolymer may have a weight average molecular weight (Mw) of about 500 g/mole to about 3,000 g/mole. The urethane-based prepolymer may have a weight average molecular weight (Mw) of, for example, about 1,000 g/mole to about 2,000 g/mole, for example, about 1,000 g/mole to about 1,500 g/mole.

In an embodiment, the isocyanate compound for the preparation of the urethane-based prepolymer may comprise an aromatic diisocyanate compound, and the aromatic diisocyanate compound, for example, may comprise 2,4-toluene diisocyanate (2,4-TDI) and 2,6-toluene diisocyanate (2,6-TDI). The polyol compound for the preparation of the urethane-based prepolymer may comprise polytetramethylene ether glycol (PTMEG) and diethylene glycol (DEG).

In another embodiment, the isocyanate compound for the preparation of the urethane-based prepolymer may comprise an aromatic diisocyanate compound and an alicyclic diisocyanate compound. For example, the aromatic diisocyanate compound may comprise 2,4-toluene diisocyanate (2,4-TDI) and 2,6-toluene diisocyanate (2,6-TDI), and the alicyclic diisocyanate compound may comprise dicyclohexylmethane diisocyanate (H12MDI). The polyol compound for the preparation of the urethane-based prepolymer may comprise polytetramethylene ether glycol (PTMEG) and diethylene glycol (DEG).

The urethane-based prepolymer may have an isocyanate terminal group content (NCO %) of about 9% by weight to about 12% by weight, for example, about 9% by weight to about 11% by weight, for example, about 9% by weight to about 10% by weight, for example, about 10% by weight to about 12% by weight, or, for example, about 10% by weight to about 11% by weight.

The isocyanate terminal group content (NCO %) of the urethane-based prepolymer may be designed by comprehensively adjusting the type and content of the isocyanate compound and the polyol compound for the preparation of the urethane-based prepolymer, the process conditions such as temperature, pressure, and time in the process for preparing the urethane-based prepolymer, and the type and content of the additives used in the preparation of the urethane-based prepolymer.

If the isocyanate terminal group content (NCO %) of the urethane-based prepolymer satisfies the above range, the reaction rate, reaction time, and final curing structure in the subsequent reaction between the urethane-based prepolymer and a curing agent can be adjusted in a way favorable to the polishing performance from the viewpoint of the use and purpose of the final polishing pad.

According to an embodiment of the present invention, the composition for forming a polishing layer comprises a foaming agent.

The foaming agent is a component for forming a pore structure in the polishing layer, and it may comprise a solid phase foaming agent.

According to an embodiment of the present invention, it is possible to control the shape of micropores and the pore coalescence phenomenon depending on the type, shape, or physical properties of the solid phase foaming agent. As a result, the surface roughness of the polishing pad before and after polishing can be adjusted.

The solid phase foaming agent may comprise expandable particles. The expandable particles are particles having a characteristic that can be expanded by heat or pressure. The size in the final polishing layer may be determined by heat or pressure applied in the process of preparing the polishing layer. The expandable particles may comprise thermally expanded particles, unexpanded particles, or a combination thereof.

The thermally expanded particles are particles previously expanded by heat. They refer to particles having little or no change in size by heat or pressure applied during the process of preparing the polishing layer.

The unexpanded particles are particles that have not been previously expanded by heat. They refer to particles whose final size is determined when expanded by heat or pressure applied during the process of preparing the polishing layer. According to an embodiment of the present invention, the solid phase foaming agent may preferably comprise unexpanded particles from the viewpoint of achieving a more uniform pore size distribution of the polishing pad.

The solid phase foaming agent comprising unexpanded particles may be microspheres encapsulating hydrocarbon gas with a polymer shell.

The expandable particles may comprise a shell of a resin; and an expansion-inducing component encapsulated inside the shell.

For example, the shell may comprise a thermoplastic resin. The thermoplastic resin may be at least one selected from the group consisting of a vinylidene chloride-based copolymer, an acrylonitrile-based copolymer, a methacrylonitrile-based copolymer, and an acrylic-based copolymer.

The expansion-inducing component may comprise one selected from the group consisting of a hydrocarbon compound, a chlorofluoro compound, a tetraalkylsilane compound, and combinations thereof.

Specifically, the hydrocarbon may comprise one selected from the group consisting of ethane, ethylene, propane, propene, n-butane, isobutane, n-butene, isobutene, n-pentane, isopentane, neopentane, n-hexane, heptane, petroleum ether, and combinations thereof.

The chlorofluoro compound may comprise one selected from the group consisting of trichlorofluoromethane ($CCl_3F$), dichlorodifluoromethane ($CCl_2F_2$), chlorotrifluoromethane (chlorotrifluoromethane, $CClF_3$) tetrafluoroethylene (tetrafluoroethylene, $CClF_2$—$CClF_2$), and combinations thereof.

The tetraalkylsilane compound may comprise one selected from the group consisting of tetramethylsilane, trimethylethylsilane, trimethylisopropylsilane, trimethyl-n-propylsilane, and combinations thereof.

The solid phase foaming agent may optionally comprise particles treated with an inorganic component. For example, the solid phase foaming agent may comprise expandable particles treated with an inorganic component. In an embodiment, the solid phase foaming agent may comprise expandable particles treated with silica ($SiO_2$) particles. The treatment of the solid phase foaming agent with an inorganic component can prevent aggregation between a plurality of particles. The solid phase foaming agent treated with an inorganic component may be different from the solid phase foaming agent that is not treated with an inorganic component in terms of the chemical, electrical, and/or physical properties of the surface of the foaming agent.

The content of the solid phase foaming agent may be about 0.5 part by weight to about 10.0 parts by weight, for example, about 1.0 part by weight to about 6.0 parts by weight, for example, about 1.5 parts by weight to about 5.5 parts by weight, for example, about 2.0 parts by weight to about 5.0 parts by weight, based on 100 parts by weight of the urethane-based prepolymer.

According to an embodiment of the present invention, as the solid phase foaming agent is used, excellent polishing characteristics and mechanical properties can be achieved without using a liquid phase foaming agent, a gas phase foaming agent, or both.

The type and content of the solid phase foaming agent may be designed according to the desired pore structure and physical properties of the polishing layer.

The composition for preparing a polishing layer may further comprise other additives such as a surfactant and a reaction rate controlling agent. The names such as "surfactant" and "reaction rate controlling agent" are arbitrary names based on the main role of the substances. The respective substances do not necessarily perform only a function limited to the role defined by the names.

The surfactant is not particularly limited as long as it acts to prevent pores from coalescing and overlapping with each other. For example, the surfactant may comprise a silicone-based surfactant.

The surfactant may be employed in an amount of about 0.2 part by weight to about 2 parts by weight based on 100 parts by weight of the urethane-based prepolymer. Specifically, the surfactant may be employed in an amount of about 0.2 part by weight to about 1.9 parts by weight, for example, about 0.2 part by weight to about 1.8 parts by weight, for example, about 0.2 part by weight to about 1.7 parts by weight, for example, about 0.2 part by weight to about 1.6 parts by weight, for example, about 0.2 part by weight to about 1.5 parts, for example, 0.5 part by weight to 1.5 parts by weight, based on 100 parts by weight of the urethane-based prepolymer. If the amount of the surfactant is within the above range, pores can be stably formed and maintained in the mold.

The reaction rate controlling agent serves to promote or retard the reaction. A reaction promoter, a reaction retarder, or both may be used depending on the purpose. The reaction rate controlling agent may comprise a reaction promoter. For example, the reaction rate controlling agent may be at least one reaction promoter selected from the group consisting of a tertiary amine-based compound and an organometallic compound.

Specifically, the reaction rate controlling agent may comprise at least one selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl) ether, trimethylaminoethylethanolamine, N,N,N,N,N,N"-pentamethyldiethylenetriamine, dimethylaminoethylamine, dimethylaminopropylamine, benzyldimethylamine, N-ethylmorpholine, N,N-dimethylaminoethylmorpholine, N,N-dimethylcyclohexylamine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may comprise at least one selected from the group consisting of benzyldimethylamine, N,N-dimethylcyclohexylamine, and triethylamine.

The reaction rate controlling agent may be employed in an amount of about 0.05 part by weight to about 2 parts by weight based on 100 parts by weight of the urethane-based prepolymer. Specifically, the reaction rate controlling agent may be employed in an amount of about 0.05 part by weight to about 1.8 parts by weight, for example, about 0.05 part by weight to about 1.7 parts by weight, for example, about 0.05 part by weight to about 1.6 parts by weight, for example, about 0.1 part by weight to about 1.5 parts by weight, for example, about 0.1 part by weight to about 0.3 part by weight, for example, about 0.2 part by weight to about 1.8 parts by weight, for example, about 0.2 part by weight to about 1.7 parts by weight, for example, about 0.2 part by weight to about 1.6 parts by weight, for example, about 0.2 part by weight to about 1.5 parts by weight, for example, about 0.5 part by weight to about 1 part by weight, based on 100 parts by weight of the urethane-based prepolymer. If the reaction rate controlling agent is used in the above content range, the curing reaction rate of the prepolymer composition may be appropriately controlled to form a polishing layer having pores of a desired size and hardness.

In an embodiment, the content of an inorganic substance in the polishing layer may be about 5 ppm to about 500 ppm.

The inorganic substance, for example, may comprise at least one element selected from the group consisting of a silicon (Si) element, a phosphorus (P) element, and a calcium (Ca) element.

The inorganic substance may be derived from various sources. For example, the inorganic substance may be derived from various additives such as a foaming agent used in the preparation of the polishing layer. Here, the additive serving as the source of the inorganic substance, for example, may include one selected from the group consisting of a foaming agent, a surfactant, a reaction rate controlling agent, and a combination thereof.

The content of an inorganic substance in the polishing layer may be designed in an appropriate range by using only one of a foaming agent and an additional additive and adjusting the type and content thereof or may be designed in an appropriate range by using both a foaming agent and an additional additive and adjusting the type and content thereof.

The content of an inorganic substance in the polishing layer may be about 5 ppm to about 500 ppm, for example, about 5 ppm to about 400 ppm, for example, about 8 ppm to about 300 ppm, for example, about 220 ppm to about 400 ppm, for example, about 5 ppm to about 180 ppm. In such event, the content of an inorganic substance in the polishing layer may be measured by inductively coupled plasma atomic emission spectrometer (ICP) analysis Hereinafter, the process for preparing a polishing pad will be described in detail.

[Process for Preparing a Polishing Pad]

In another embodiment of the present invention, there may be provided a process for preparing a polishing pad, which comprises mixing a urethane-based prepolymer, a curing agent, and a foaming agent to prepare a composition for preparing a polishing layer; and injecting the composition for preparing a polishing layer into a mold and curing it to obtain a polishing pad comprising a polishing layer, wherein the curing agent comprises a tertiary amine-based polyol containing an ether bond, and the polishing pad has a surface roughness reduction rate (RSk (%)) of less than 50% as represented by the above Equation 1 and a recovery elasticity resistance index (RERI) of 40 or less as represented by the above Equation 2.

Referring to FIG. 3, the process (S100) for preparing a polishing pad comprising a polishing layer comprises the step of preparing a composition for preparing a polishing layer (S110).

The composition for preparing a polishing layer may be obtained by mixing a urethane-based prepolymer, a curing agent, and a foaming agent.

The urethane-based prepolymer may be prepared by reacting a diisocyanate compound with a polyol compound. Details on the diisocyanate compound and the polyol compound are as described above with respect to the polishing pad.

The prepolymer composition may have an isocyanate group (NCO group) content of about 9% by weight to about 12% by weight, for example, about 9% by weight to about 11% by weight, for example, about 9% by weight to about 10% by weight, for example, about 10% by weight to about 12% by weight, or, for example, about 10% by weight to about 11% by weight.

The content of isocyanate groups in the urethane-based prepolymer composition may be derived from terminal isocyanate groups of the urethane-based prepolymer, unreacted isocyanate groups in the diisocyanate compound, and the like.

The urethane-based prepolymer composition may have a viscosity of about 100 cps to about 1,000 cps, for example, about 200 cps to about 800 cps, for example, about 200 cps to about 600 cps, for example, about 200 cps to about 550 cps, for example, about 300 cps to about 500 cps at about 80° C.

Detailed compositions of the foaming agent and the curing agent are as described above.

The urethane-based prepolymer and the curing agent react with each other upon the mixing thereof to form a solid polyurethane, which is then formed into a sheet or the like. Specifically, an isocyanate (NCO) terminal group in the urethane-based prepolymer can react with an amine group, an alcohol group, and the like in the curing agent. Specifically, an isocyanate (NCO) group at the end of the urethane-based prepolymer is reacted with a hydroxyl (OH) group of the tertiary amine-based polyol to form a urethane bond. In addition, an isocyanate (NCO) group at the end of the urethane-based prepolymer is reacted with an amine (NH) group of the aromatic amine compound to form a urea bond.

If a mixture of the tertiary amine-based polyol and the aromatic amine compound is used as the curing agent, the rate of reaction between an isocyanate (NCO) group at the end of the urethane-based prepolymer and a hydroxyl (OH) group of the tertiary amine-based polyol to form a urethane bond is faster than the rate of reaction between an isocyanate (NCO) group at the end of the urethane-based prepolymer and an amine (NH) group of the aromatic amine compound to form a urea bond. That is, since the tertiary amine-based polyol can act as a catalyst, the reaction rate may be faster. In particular, since the unshared electron pair of the tertiary amine in the tertiary amine-based polyol strongly pulls electrons, it may accelerate the reaction.

In such an event, a foaming agent such as a solid phase foaming agent is uniformly dispersed in the raw materials to form pores without participating in the reaction between the urethane-based prepolymer and the curing agent.

According to an embodiment of the present invention, the urethane-based prepolymer, the curing agent, and the foaming agent may be subjected to the mixing process substantially at the same time. In addition, if a surfactant, an inert gas, and the like are further added, they may also be subjected to the mixing process substantially at the same time.

As another example, the urethane-based prepolymer, the foaming agent, and the surfactant may be mixed in advance, and the curing agent may be subsequently introduced.

In the mixing process, the reaction of the urethane-based prepolymer and the curing agents is initiated by mixing them, and the foaming agent is uniformly dispersed in the raw materials. In such an event, a reaction rate controlling agent may intervene in the reaction between the urethane-based prepolymer and the mixture of curing agents from the beginning of the reaction, to thereby control the reaction rate. Specifically, the mixing may be carried out at a rate of 1,000 to 10,000 rpm or 4,000 to 7,000 rpm. Within the above speed range, it may be more advantageous for the foaming agent to be uniformly dispersed in the raw materials.

The process (S100) for preparing a polishing pad comprises injecting the composition for preparing a polishing layer into a mold and curing it (S120) to obtain a polishing pad comprising a polishing layer.

In an embodiment, the step of obtaining a polishing pad comprising a polishing layer comprises preparing a mold preheated to a first temperature; and injecting the composition for preparing a polishing layer as a raw material mixture into the preheated mold and curing the mixture.

In an embodiment, when the composition for preparing a polishing layer is injected into the preheated mold, an inert gas, specifically, nitrogen ($N_2$) gas may not be injected. In general, when the composition for preparing a polishing layer is injected, for example, nitrogen ($N_2$) may be injected. In the present invention, if an inert gas is injected, the density may become unstable due to the use of the tertiary amine-based polyol of specific components. In particular, if the tertiary amine-based polyol is used as the curing agent, the curing rate is fast, so that it may be difficult to inject an inert gas.

In an embodiment, the first temperature may be about 60° C. to about 120° C., for example, about 65° C. to about 110° C., for example, about 70° C. to about 110° C.

The step of curing the composition for preparing a polishing layer at the first temperature may be carried out for about 5 minutes to about 60 minutes, for example, about 5 minutes to about 40 minutes, for example, about 5 minutes to about 30 minutes, for example, about 5 minutes to about 25 minutes.

The reaction between the urethane-based prepolymer and the curing agent is completed in the mold to thereby produce a molded body in the form of a solidified cake that conforms to the shape of the mold.

Thereafter, the molded body thus obtained may be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. In such an event, a reaction retarder may be used as a reaction rate controlling agent in order to secure a sufficient solidification time. Thus, the height of the mold may be about 5 to about 50 times the thickness of the polishing pad to be finally produced to prepare sheets therefor. However, the sliced sheets may have pores of different diameters depending on the molded location inside the mold. That is, a sheet molded at the lower position of the mold may have pores of a fine diameter, whereas a sheet molded at the upper position of the mold may have pores of a larger diameter than that of the sheet formed at the lower position.

Therefore, it is preferable to use a mold capable of producing one sheet by one molding in order for each sheet to have pores of a uniform diameter. To this end, the height of the mold may not significantly differ from the thickness of the polishing pad to be finally produced. For example, the molding may be carried out using a mold having a height of 1 to 3 times the thickness of the polishing pad to be finally produced. More specifically, the mold may have a height of 1.1 to 4.0 times, or 1.2 to 3.0 times, the thickness of the polishing pad to be finally produced. In such an event, a reaction promoter may be used as the reaction rate controlling agent to form pores having a more uniform diameter. The polishing pad prepared from a single sheet may have a thickness of 1 mm to 10 mm. Specifically, the polishing pad may have a thickness of 1 mm to 9 mm, 1 mm to 8.5 mm, 1.5 mm to 10 mm, 1.5 mm to 9 mm, 1.5 mm to 8.5 mm, 1.8 mm to 10 mm, 1.8 mm to 9 mm, or 1.8 mm to 8.5 mm.

Thereafter, the top and bottom ends of the molded body obtained from the mold may be cut out, respectively. For example, each of the top and bottom ends of the molded body may be cut out by ⅓ or less, 1/22 to 3/10, or 1/12 to ¼ of the total thickness of the molded body.

As a specific example, the molding is carried out using a mold having a height of 1.2 to 2 times the thickness of the polishing pad to be finally produced, and a further step of cutting out each of the top and bottom ends of the molded body obtained from the mold upon the molding by $\frac{1}{12}$ to $\frac{1}{4}$ of the total thickness of the molded body may then be carried out.

Subsequent to the above cutting step, the above preparation process may further comprise the steps of machining grooves on the surface of the molded body, bonding with the lower part, inspection, packaging, and the like. These steps may be carried out in a conventional manner for preparing a polishing pad.

In addition, the polishing pad prepared by the preparation process as described above may have all of the characteristics of the polishing pad according to the embodiment as described above.

Meanwhile, according to an embodiment, the process may further comprise machining the polishing layer.

The step of machining at least one side of the polishing layer may comprise (1) forming grooves on at least one side of the polishing layer; (2) line turning at least one side of the polishing layer; and (3) roughening at least one side of the polishing layer.

In step (1), the grooves may comprise at least one of concentric circular grooves spaced apart from the center of the polishing layer at a certain interval; and radial grooves continuously connected from the center of the polishing layer to the edge of the polishing layer.

In step (2), the line turning may be carried out by cutting the polishing layer in a certain thickness using a cutting tool.

In step (3), the roughening may be carried out by machining the surface of the polishing layer with a sanding roller.

The process for preparing a polishing pad may further comprise laminating a cushion layer on the side of the polishing layer opposite to the polishing surface.

The polishing layer and the cushion layer may be laminated using a heat-sealing adhesive.

The heat-sealing adhesive is applied on the side of the polishing layer opposite to the polishing surface, the heat-sealing adhesive is applied on the surface of the cushion layer to be in contact with the polishing layer, the polishing layer and the cushion layer are laminated such that the sides to which the heat-sealing adhesive has been applied come into contact, and the two layers may be fused using a pressure roller.

The cushion layer serves to support the polishing layer and to absorb and disperse an impact applied to the polishing layer. Thus, it is possible to minimize damage and defects to the object to be polished during the polishing process using the polishing pad.

The cushion layer may comprise a nonwoven fabric or a suede, but it is not limited thereto.

In an embodiment, the cushion layer may be a resin-impregnated nonwoven fabric. The nonwoven fabric may be a fibrous nonwoven fabric comprising one selected from the group consisting of a polyester fiber, a polyamide fiber, a polypropylene fiber, a polyethylene fiber, and combinations thereof.

The resin impregnated in the nonwoven fabric may comprise a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicone rubber resin, a polyester-based elastomer resin, a polyamide-based elastomer resin, and combinations thereof.

[Process for Preparing a Semiconductor Device]

According to still another embodiment of the present invention, there is provided a process for preparing a semiconductor device, which comprises providing a polishing pad comprising a polishing layer; and relatively rotating the polishing surface of the polishing layer and the surface of an object to be polished while they are in contact with each other to polish the object to be polished, wherein the polishing pad comprises a polishing layer, the polishing layer comprises a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the above Equation 1 and a recovery elasticity resistance index (RERI) of 40 or less as represented by the above Equation 2.

Referring to FIG. 4, the process for preparing a semiconductor device (S200) comprises providing a polishing pad comprising a polishing layer (S210).

The step of providing a polishing pad comprising a polishing layer (S210) is as described above.

The process for preparing a semiconductor device (S200) comprises polishing an object to be polished (S220).

Specifically, once the polishing pad according to an embodiment is mounted on a platen, a semiconductor substrate is disposed on the polishing pad. In such an event, the semiconductor substrate may be a semiconductor substrate, and the surface of the semiconductor substrate comes into direct contact with the polishing surface of the polishing pad. A polishing slurry may be sprayed through a nozzle on the polishing pad for polishing. The flow rate of the polishing slurry supplied through the nozzle may be selected according to the purpose within a range of about 10 cm$^3$/minute to about 1,000 cm$^3$/minute. For example, it may be about 50 cm$^3$/minute to about 500 cm$^3$/minute, but it is not limited thereto.

Thereafter, the semiconductor substrate and the polishing pad rotate relatively to each other, so that the surface of the semiconductor substrate is polished. In such an event, the rotation direction of the semiconductor substrate and the rotation direction of the polishing pad may be the same direction or opposite directions. The rotation speeds of the semiconductor substrate and the polishing pad may be selected according to the purpose within a range of about 10 rpm to about 500 rpm. For example, it may be about 30 rpm to about 200 rpm, but it is not limited thereto.

The semiconductor substrate mounted on the polishing head is pressed against the polishing surface of the polishing pad at a predetermined load to be in contact therewith, the surface thereof may then be polished. The load applied by the polishing head to make the surface of the semiconductor substrate in contact with the polishing surface of the polishing pad may be selected according to the purpose within a range of about 1 gf/cm$^2$ to about 1,000 gf/cm$^2$. For example, it may be about 10 gf/cm$^2$ to about 800 gf/cm$^2$, but it is not limited thereto.

According to an embodiment of the present invention, the polishing pad can achieve low hardness by comprising a polishing layer formed using a curing agent of specific components. It is possible to enhance the mechanical properties of the polishing pad, as well as to improve the surface defects appearing on the surface of a semiconductor substrate, by controlling the surface roughness reduction rate and the recovery elasticity index of the polishing pad to specific ranges. It is also possible to further enhance the polishing rate. Thus, it is possible to efficiently fabricate a semiconductor device of excellent quality using the polishing pad.

EMBODIMENTS FOR CARRYING OUT THE INVENTION

Hereinafter, the present invention is explained in detail by the following Examples. However, these examples are set forth to illustrate the present invention, and the scope of the present invention is not limited thereto.

EXAMPLE

Example 1: Preparation of a Polishing Pad (1) Preparation of a Urethane-Based Prepolymer A four-necked flask was charged with toluene diisocyanate (TDI; BASF), dicyclohexylmethane diisocyanate (H12MDI), polytetramethylene ether glycol (Korea PTG), and diethylene glycol, followed by reaction thereof at 80° C. for 3 hours, thereby preparing a urethane-based prepolymer. Here, the NCO % was adjusted to 10%.

(2) Preparation of a Polishing Pad

A casting machine equipped with tanks and feeding lines for the raw materials such as a urethane-based prepolymer, a curing agent, and a foaming agent was provided. With the urethane-based prepolymer prepared above, a mixed curing agent was prepared as a curing agent in which 1,2-ethanediamine polymer containing methyloxirane (LA-480, CAS No. 25214-63-5) as a tertiary amine-based polyol and N,N'-bis(sec-butylamino)diphenylmethane as an aromatic amine compound were mixed at a weight ratio of 50:50. A solid phase foaming agent (551DU40, Akzonobel) containing unexpanded particles was prepared. In addition, a silicone-based surfactant (Evonik) was prepared.

In a casting machine equipped with feeding lines for a urethane-based prepolymer, a mixed curing agent, a solid phase foaming agent, and a surfactant, the urethane-based prepolymer prepared to have an NCO % of 10% was charged to the prepolymer tank, the mixed curing agent was charged to the curing agent tank. While a solid phase foaming agent was fed at the same time, they were stirred at a rotational speed of the mixing head of 5,000 rpm. Here, the content of each component is shown in Table 1, and the equivalent ratio of the urethane-based prepolymer and the mixed curing agent was adjusted to 1:1. The mixture was discharged at a rate of 10 kg per minute, injected into a mold preheated to 100° C. and having a shape of an opening of 1,000 mm in length and in width, respectively, and 3 mm in height, and solidified through a thermal curing reaction to obtain a molded body.

Thereafter, the solidified material of the molded body was sliced and processed into a sheet form. The processed sheet was subjected to a grooving process to obtain one sheet (or polishing layer) having a thickness of 2 mm. The finished sheet was laminated with a sub pad using an adhesive to finally obtain a polishing pad.

Examples 2 to 3

The same procedures as in Example 1 were carried out to obtain a polishing pad except that the weight ratio of the tertiary amine-based polyol and the aromatic amine compound was changed as shown in Table 1 below.

Example 4

The same procedures as in Example 1 were carried out to obtain a polishing pad except that 1,2-ethanediamine polymer containing methyloxirane (LA-480, CAS No. 25214-63-5) as a tertiary amine-based polyol was used alone as a curing agent as shown in Table 1 below.

Comparative Example 1

The same procedures as in Example 1 were carried out to obtain a polishing pad except that 4,4'-methylenebis(2-chloroaniline) (MOCA) was used alone as a curing agent as shown in Table 1 below.

Comparative Example 2

The same procedures as in Example 1 were carried out to obtain a polishing pad except that a mixed curing agent of 1,2-ethanediamine polymer containing methyloxirane (LA-480, CAS No. 25214-63-5) as a tertiary amine-based polyol and 4,4'-methylenebis(2-chloroaniline) (MOCA) was used as a curing agent as shown in Table 1 below.

Table 1 below summarizes the detailed conditions for the CMP process.

TABLE 1

| | Ex. 1 | Ex. 2 | Ex. 3 | Ex. 4 | C. Ex. 1 | C. Ex. 2 |
|---|---|---|---|---|---|---|
| NCO content (%) of prepolymer | 10% | 10% | 10% | 10% | 10% | 10% |
| Tertiary amine-based polyol:aromatic amine compound (weight ratio) | 50:50 | 70:30 | 80:20 | 100:0 | MOCA 100 | 50:50 |
| Casting mold | Single layer | Single layer | Single layer | Single layer | Single layer | Single layer |
| Sheet machining (casting, cutting, and grooving) | sequential | sequential | sequential | sequential | sequential | sequential |
| Prepolymer (part by weight) | 100 | 100 | 100 | 100 | 100 | 100 |
| Surfactant (part by weight) | 1.0 | 1.0 | 1.0 | 1.0 | 1.0 | 1.0 |
| Solid phase foaming agent (part by weight) | 4.0 | 4.0 | 4.0 | 4.0 | 4.0 | 4.0 |

MOCA: 4,4'-methylenebis(2-chloroaniline)

Test Example

Test Example 1: Physical Properties

The polishing pads obtained in the Examples and Comparative Example were tested for the following items. The results are shown in Table 3.

(1) Hardness

The Shore D hardness of the polishing pads prepared in the Examples and the Comparative Examples was measured. The polishing pads prepared in the Examples and the Comparative Examples were each cut into a size of 2 cm×2 cm (thickness: 2 mm) and then allowed to stand for 16 hours at a temperature of 25° C. Thereafter, the hardness of the polishing pad was measured using a hardness meter (D-type hardness meter).

(2) Specific Gravity

The polishing pads prepared in the Examples and the Comparative Examples were each cut into a rectangle of 4 cm×8.5 cm (thickness: 2 mm) and then allowed to stand for 16 hours in an environment of a temperature of 23±2° C. and a humidity of 50±5%. The specific gravity of the polishing pad was measured using a gravimeter.

(3) Tensile Strength

The polishing pads prepared in the Examples and the Comparative Examples were each cut to 4 cm×1 cm (thickness: 2 mm). The ultimate strength immediately before the fracture was measured while the polishing pad was tested at a rate of 50 mm/minute using a universal testing machine (UTM).

(4) Elongation

The polishing pads prepared in the Examples and the Comparative Examples were each cut to 4 cm×1 cm (thickness: 2 mm). The maximum deformation immediately before the fracture was measured while the polishing pad was tested at a rate of 50 mm/minute using a universal testing machine (UTM). The ratio of the maximum deformation to the initial length was expressed in percent (%).

Test Example 2: Surface Roughness

The polishing pads prepared according to the Examples and Comparative Examples were each measured the Sk values before and after polishing using a roughness measuring device (manufacturer: Bruker, model name: contour-gt) under the conditions of Table 2. The surface roughness reduction rate (RSk (%)) was calculated according to the following Equation 1.

$$RSk\ (\%) = \frac{Sk_1 - Sk_2}{Sk_1} \times 100 \qquad \text{[Equation 1]}$$

In Equation 1, $Sk_1$ is the core roughness depth of the polishing pad before polishing, and $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute.

$Sk_1$ and $Sk_2$ are each a value calculated from data measured by an optical surface roughness meter for the polishing pad before polishing and the polishing pad after polishing in accordance with the ISO 25178-2 standard.

TABLE 2

| | Details | Measurement conditions |
|---|---|---|
| Measurement | Measurement mode | VSI/VXI |
| | Eyepiece | Magnification of 5 |
| | Object lens | Magnification of 1.5 |
| Measurement area | X-axis | 1,182.6 μm |
| | Y-axis | 893.8 μm |
| Scan options | Speed | ×1 |
| | Backscan | 10 μm |
| | Length | 80 μm |
| | Threshold value | 5% |

Test Example 3: Scanning Electron Microscopy (SEM)

The cross-sections of the polishing pads prepared in the Examples and Comparative Examples were observed by scanning electron microscopy (SEM) and are shown in FIG. 5. In FIG. 5, (a) shows SEM images of the cross-sections of the polishing pads prepared in Examples 1 to 3 and Comparative Example 1 observed at a magnification of 100. In FIG. 5, (b) shows SEM images of the cross-sections of the polishing pads prepared in Examples 1 to 3 and Comparative Example 1 observed at a magnification of 300.

As shown in FIG. 5, the pores of the polishing pads of Examples 1 to 3 are finely and uniformly distributed over a large area as compared with Comparative Example 1.

Test Example 4: Polishing Rate (Removal Rate)

The initial polishing rate immediately after the polishing pad had been prepared was measured as follows.

A silicon wafer having a diameter of 300 mm was deposited with silicon oxide by a chemical vapor deposition (CVD) process. The polishing pad was mounted on a CMP machine, and the silicon wafer was set with the silicon oxide layer thereof facing the polishing surface of the polishing pad. Thereafter, the silicon oxide layer was polished under a polishing load of 4.0 psi while the platen was rotated at a speed of 100 rpm for 60 seconds and a calcined silica slurry was supplied onto the polishing pad at a rate of 250 ml/min. Upon completion of the polishing, the silicon wafer was detached from the carrier, mounted in a spin dryer, washed with deionized water (DIW), and then dried with nitrogen ($N_2$) for 15 seconds. The film thickness of the dried silicon wafer was measured before and after the polishing using a spectral reflectometer type thickness measuring instrument (Manufacturer: Keyence, Model: SI-F80R). The polishing rate was calculated using the following Equation 3.

Polishing rate (Å/min)=polished thickness of a silicon wafer (Å)/polishing time (minute)   [Relationship 3]

Test Example 5: Measurement of Surface Defects

After the polishing process was carried out using each of the polishing pads of the Examples and the Comparative Examples, the residues, scratches, and chatter marks appearing on the wafer surface upon the polishing was measured using a wafer inspection device (AIT XP+, KLA Tencor) (threshold: 150, die filter threshold: 280).

Specifically, after polishing, the silicon wafer was transferred to a cleaner and cleaned for 10 seconds each using 1% HF, purified water (DIW), 1% $H_2NO_3$, and purified water (DIW). Thereafter, it was transferred to a spin dryer, washed with purified water (DIW), and then dried with nitrogen for 15 seconds. The dried silicon wafer was measured for the changes in defects before and after the polishing using the wafer inspection device.

The residue refers to a substantially amorphous foreign matter that adheres to the wafer surface. For example, it refers to a defect of the shape as shown in FIG. 6.

The scratch refers to a substantially continuous linear scratch. For example, it refers to a defect of the shape as shown in FIG. 7.

Meanwhile, the chatter mark refers to a substantially discontinuous linear scratch. For example, it refers to a defect of the shape as shown in FIG. 8.

The total number of defects of residues, scratches, and chatter marks is shown in Table 4 below.

ranges, were overall excellent in mechanical properties such as hardness, tensile strength, and elongation.

Specifically, the polishing pads of Examples 1 to 4 had a hardness of 45.6 to 47.3 Shore D, thereby achieving low hardness. In contrast, the polishing pad of Comparative Example 1 had a hardness of 65.7 Shore D. and the polishing pad of Comparative Example 2 had a hardness of 52.1 Shore D. Since they had a hardness higher than those of the polishing pads of Examples 1 to 4, they were relatively harder.

In addition, the polishing pads of Examples 1 to 4 had a tensile strength of 16.5 $N/mm^2$ to 19.2 $N/mm^2$ and an elongation of 232% to 302%. In contrast, the polishing pads of Comparative Examples 1 and 2 had a very high tensile

TABLE 3

| | | | Evaluation item | | | | | |
|---|---|---|---|---|---|---|---|---|
| | | | Ex. 1 | Ex. 2 | Ex. 3 | Ex. 4 | C. Ex. 1 | C. Ex. 2 |
| Tertiary amine-based polyol:aromatic amine compound (weight ratio) | | | 50:50 | 70:30 | 80:20 | 100:0 | MOCA | 50:50 |
| Physical properties | Upper pad | Thickness (mm) | 2 | 2 | 2 | 2 | 2 | 2 |
| | | Hardness ($H_{25}$) (Shore D) | 47.3 | 47.1 | 46.7 | 45.6 | 65.7 | 52.1 |
| | | Specific gravity (g/cc) | 0.80 | 0.81 | 0.81 | 0.8 | 0.80 | 0.8 |
| | | Tensile strength ($N/mm^2$) | 19.2 | 18.5 | 17.7 | 16.5 | 25.3 | 20.2 |
| | | Elongation (%) | 232 | 268 | 289 | 302 | 72 | 130 |
| | Sub-pad | Type | Nonwoven fabric | Nonwoven fabric | Nonwoven fabric | Nonwoven fabric | Nonwoven fabric | Nonwoven fabric |
| | | Thickness (mm) | 1.1 | 1.1 | 1.1 | 1.1 | 1.1 | 1.1 |
| | | Hardness (C) | 70 | 70 | 70 | 70 | 70 | 70 |
| | Laminated pad | Thickness (mm) | 3.32 | 3.32 | 3 32 | 3.32 | 3.32 | 3.32 |
| | | Compression rate (%) | 1.05 | 1.05 | 1.05 | 1.05 | 1.05 | 1.05 |
| Roughness | | $Sk_1$ (μm) | 24.8 | 24.0 | 24.8 | 25.4 | 23.8 | 23.9 |
| | | $Sk_2$ (μm) | 13.2 | 14.0 | 16.2 | 16.5 | 8.0 | 8.5 |
| | | $Sk_1 - Sk_2$ (μm) | 11.6 | 10.0 | 8.6 | 8.9 | 15.8 | 15.4 |
| | | [Equation 1] RSk (%) | 46.8 | 41.7 | 34.7 | 35.0 | 66.4 | 64.4 |
| | | [Equation 2] Recovery elasticity resistance index (RERI) | 22.14 | 19.64 | 16.20 | 15.98 | 43.62 | 33.57 |

MOCA: 4,4'-methylenebis(2-chloroaniline)
$Sk_1$: core roughness depth of the polishing pad before polishing
$Sk_2$: core roughness depth of the polishing pad after polishing

[Equation 1] $RSk\ (\%) = \dfrac{Sk_1 - Sk_2}{Sk_1} \times 100$

[Equation 2] Recovery elasticity resistance index $(RERI) = \dfrac{RSk\ (\%)}{100\ (\%)} \times H_{25}$

TABLE 4

| | Ex. 1 | Ex. 2 | Ex. 3 | Ex. 4 | C. Ex. 1 | C. Ex. 2 |
|---|---|---|---|---|---|---|
| Polishing rate (Å/min) | 1,715 | 1,695 | 1,703 | 1,702 | 3,765 | 3,200 |
| Surface defect | 8 | 7 | 3 | 4 | 25 | 22 |

As can be seen from Table 3, the polishing pads of Examples 1 to 4, in which a tertiary amine-based polyol containing an ether bond was used as a curing agent, and the surface roughness reduction rate (RSk (%)) and recovery elasticity resistance index (RERI) were adjusted to specific strength of 25.3 $N/mm^2$ and 20.2 $N/mm^2$ and a very low elongation of 72% and 130%, respectively.

In particular, as the content of the tertiary amine-based polyol containing an ether bond was increased in the polishing pads of Examples 1 to 4, the hardness and tensile strength were decreased, and the elongation was increased, so that the mechanical properties desired in the present invention could be achieved.

Such mechanical properties can enhance the polishing performance of the polishing pad and the effect of reducing surface defects appearing on the surface of a semiconductor substrate.

Specifically, as can be seen from Table 4, the polishing pads of Examples 1 to 4 had excellent polishing rates. The number of surface defects such as residues, surface scratches, and chatter marks appearing on the wafer surface was significantly lower than those in the case where the polishing pads of Comparative Examples 1 and 2 were used.

Specifically, the polishing rates of 1,695 Å/minute to 1,715 Å/minute in Examples 1 to 4 were overall excellent. In contrast, the polishing rates of the polishing pads in Comparative Examples 1 and 2 were 3,765 Å/minute and 3,200 Å/minute in which the initial polishing rate was excessively high due to an increase in the ratio of the friction area to the pores capable of carrying the slurry. Thus, the polishing pads of Comparative Examples 1 and 2 are expected to be further increased in the polishing rate due to the pad glazing phenomenon.

In addition, in terms of surface defects appearing on the wafer surface, the number of surface defects was 3 to 8 in the case where the polishing pads of Examples 1 to 4 were used, whereas the number of surface defects exceeded 20 in the case where the polishing pads of Comparative Examples 1 and 2 were used, which was significantly increased by 3 to 8 times or more as compared with the case where the polishing pads of Examples 1 to 4 were used. It is understood that the surface defects appearing on the wafer surface were increased due to the pad glazing phenomenon of the polishing pad of Comparative Example 1.

Meanwhile, when Example 1 and Comparative Example 2 in which the same content of a mixed curing agent was used are compared, the polishing pad of Example 1 in which a mixed curing agent of LA-480 as a tertiary amine-based polyol and N,N'-bis(sec-butylamino)diphenylmethane as an aromatic amine compound was used satisfied both the surface roughness reduction rate (RSk (%)) and the recovery elasticity resistance index (RERI) in specific ranges as desired in the present invention as compared with the polishing pad of Comparative Example 1 in which LA-480 and MOCA were used. As a result, it was confirmed that the polishing pad of Example 1 was significantly enhanced in mechanical properties as well as in polishing rate and improvements of surface defects appearing on the wafer surface as compared with the polishing pad of Comparative Example 2.

Accordingly, as a curing agent of a specific component is used and as the surface roughness reduction rate (RSk (%)) and the recovery elasticity resistance index (RERI) are adjusted to specific ranges, mechanical properties in terms of low hardness, low tensile strength, and high elongation can be enhanced. In particular, since the polishing pad has a low surface roughness reduction rate (RSk (%)), it is possible to minimize the pad glazing phenomenon. As a result, there is a great advantage in that the polishing rate and the surface defects on a wafer surface can be reduced.

REFERENCE NUMERAL OF THE DRAWINGS

| 110: head | 120: semiconductor substrate (or wafer) |
|---|---|
| 130: platen | 140: slurry |
| 150: pores | |

The invention claimed is:

1. A polishing pad, which comprises a polishing layer, wherein the polishing layer comprises a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the following Equation 1 and a recovery elasticity resistance index (RERI) of 40 or less as represented by the following Equation 2:

$$RSk\ (\%) = \frac{Sk_1 - Sk_2}{Sk_1} \times 100 \qquad \text{[Equation 1]}$$

in Equation 1, $Sk_1$ is the core roughness depth of the polishing pad before polishing, $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute, and $Sk_1$ and $Sk_2$ are each a value calculated from data measured by an optical surface roughness meter for the polishing pad before polishing and the polishing pad after polishing in accordance with the ISO 25178-2 standard, $$\text{Recovery elasticity resistance index } (RERI) = \frac{Rsk\ (\%)}{100\ (\%)} \times H_{25} \qquad \text{[Equation 2]}$$

in Equation 2, RSk (%) is as defined in Equation 1 above, $H_{25}$ is the Shore D hardness of the polishing pad measured at 25° C., and the recovery elasticity resistance index (RERI) is a ratio between values excluding units, wherein the polishing pad has a tensile strength of 10 N/mm² to 25 N/mm², and an elongation of 80% to 320%.

2. The polishing pad of claim 1, wherein the difference ($Sk_1$-$Sk_2$) between $Sk_1$ and $Sk_2$ is 15 µm or less.

3. The polishing pad of claim 1, wherein $Sk_2$ is 3 µm to 30 µm.

4. The polishing pad of claim 1, wherein $H_{25}$ is 40 Shore D to 60 Shore D.

5. The polishing pad of claim 1, wherein the tertiary amine-based polyol is represented by the following formula:

[Formula]

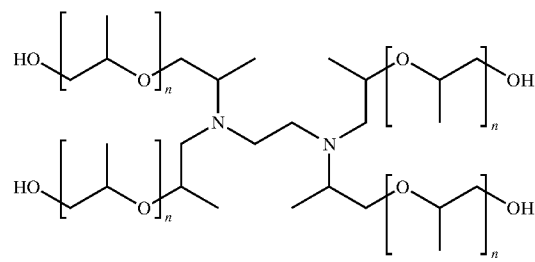

in the above formula, n is an integer of 1 to 10.

6. The polishing pad of claim 1, wherein the curing agent comprises a methyloxirane-containing 1,2-ethanediamine polymer compound.

7. The polishing pad of claim 1, wherein the curing agent further comprises an aromatic amine compound.

8. The polishing pad of claim 7, wherein the content of the tertiary amine-based polyol is the same as, or greater than, the content of the aromatic amine compound by weight.

9. The polishing pad of claim 8, wherein the mixing weight ratio of the tertiary amine-based polyol to the aromatic amine compound is 5:5 to 8:2.

10. The polishing pad of claim 5, wherein the tertiary amine-based polyol has a weight average molecular weight of 400 to 3,000 g/mole.

11. The polishing pad of claim 7, wherein the aromatic amine compound has a weight average molecular weight of 450 to 600 g/mole.

12. The polishing pad of claim 7, wherein the aromatic amine compound comprises at least one selected from the group consisting of diethyltoluenediamine; 3,5-dimethylthio-2,4-toluene diamine; 3,5-diethyltoluene-2,4-diamine; N,N'-bis-(sec-butylamino)-diphenylmethane; 4,4'-methylene-bis-(3-chloro-2,6-diethylaniline); polytetramethyleneoxide-di-p-aminobenzoate; N,N'-dialkyldiamino diphenyl methane; p,p'-methylene dianiline; m-phenylenediamine; 4,4'-methylene-bis-(2,6-diethylaniline); 4,4'-methylene-bis-(2,3-dichloroaniline); 4,4'-diamino-3,3'-diethyl-5,5'-dimethyl diphenylmethane; 2,2',3,3'-tetrachlorodiamino diphenylmethane; trimethylene glycol di-p-aminobenzoate; 3,5-diamino-4-chloro benzoic acid-2-methylpropyl ester; bis(4-amino-2-chloro-3,5-diethylphenyl)methane; propanediol bis-p-aminobenzoate; butyl diaminochlorobenzoate; methylene bis-methylanthranilate; chloro diethyltoluenediamine; methylene bis-o-ethylaniline; and isomers thereof.

13. The polishing pad of claim 1, wherein the foaming agent comprises a solid phase foaming agent comprising unexpanded particles.

14. The polishing pad of claim 1, wherein the urethane-based prepolymer has a content of isocyanate terminal groups (NCO %) of 9% by weight to 12% by weight.

15. The polishing pad of claim 1, wherein the composition comprises the curing agent in an amount of 18 parts by weight to 27 parts by weight based on 100 parts by weight of the urethane-based prepolymer.

16. The polishing pad of claim 1, wherein the curing agent does not comprise 4,4'-methylenebis(2-chloroaniline) (MOCA).

17. The polishing pad of claim 1, having a polishing rate for an oxide layer of 1,600 Å/minute to 3,300 Å/minute.

18. A process for preparing a polishing pad, which comprises:
mixing a urethane-based prepolymer, a curing agent, and a foaming agent to prepare a composition for preparing a polishing layer; and
injecting the composition for preparing a polishing layer into a mold and curing it to obtain a polishing pad comprising a polishing layer,
wherein the curing agent comprises a tertiary amine-based polyol containing an ether bond, and the polishing pad has a surface roughness reduction rate (RSk (%)) of less than 50% as represented by the following Equation 1 and a recovery elasticity resistance index (RERI) of 40 or less as represented by the following Equation 2:

$$RSk\ (\%) = \frac{Sk_1 - Sk_2}{Sk_1} \times 100 \qquad \text{[Equation 1]}$$

in Equation 1, $Sk_1$ is the core roughness depth of the polishing pad before polishing, $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute, and $Sk_1$ and $Sk_2$ are each a value calculated from data measured by an optical surface roughness meter for the polishing pad before polishing and the polishing pad after polishing in accordance with the ISO 25178-2 standard,

[Equation 2]

$$\text{Recovery elasticity resistance index } (RERI) = \frac{Rsk\ (\%)}{100\ (\%)} \times H_{25} \qquad \text{[Equation 2]}$$

in Equation 2, RSk (%) is as defined in Equation 1 above, $H_{25}$ is the Shore D hardness of the polishing pad measured at 25° C., and the recovery elasticity resistance index (RERI) is a ratio between values excluding units,
wherein the polishing pad has a tensile strength of 10 N/mm² to 25 N/mm², and an elongation of 80% to 320%.

19. The process for preparing a polishing pad of claim 18, wherein the foaming agent comprises an unexpanded solid phase foaming agent, and, when the composition for preparing a polishing layer is injected into the mold, nitrogen (N₂) gas is not be injected.

20. A process for preparing a semiconductor device, which comprises:
providing a polishing pad comprising a polishing layer; and
relatively rotating the polishing surface of the polishing layer and the surface of an object to be polished while they are in contact with each other to polish the object to be polished,
wherein the polishing pad comprises a polishing layer comprising a cured product of a composition comprising a urethane-based prepolymer, a curing agent, and a foaming agent, the curing agent comprises a tertiary amine-based polyol containing an ether bond, and the polishing pad has a surface roughness reduction rate (RSk (%)) of less than 50% as represented by the following Equation 1 and a recovery elasticity resistance index (RERI) of 40 or less as represented by the following Equation 2:

$$RSk\ (\%) = \frac{Sk_1 - Sk_2}{Sk_1} \times 100 \qquad \text{[Equation 1]}$$

in Equation 1, $Sk_1$ is the core roughness depth of the polishing pad before polishing, $Sk_2$ is the core roughness depth of the polishing pad measured after it polishes a silicon oxide layer of a semiconductor substrate for 60 seconds under the conditions of a carrier pressurization of 4.0 psi, a carrier rotation speed of 87 rpm, and a platen rotation speed of 93 rpm while a calcined ceria slurry is sprayed at a rate of 250 ml/minute, and $Sk_1$ and $Sk_2$ are each a value calculated from data measured by an optical surface roughness meter for the polishing pad before polishing and the polishing pad after polishing in accordance with the ISO 25178-2 standard, $$\text{Recovery elasticity resistance index } (RERI) = \frac{Rsk\,(\%)}{100\,(\%)} \times H_{25} \quad \text{[Equation 2]}$$

in Equation 2, RSk (%) is as defined in Equation 1 above, $H_{25}$ is the Shore D hardness of the polishing pad measured at 25° C., and the recovery elasticity resistance index (RERI) is a ratio between values excluding units, wherein the polishing pad has a tensile strength of 10 N/mm² to 25 N/mm², and an elongation of 80% to 320%.

\* \* \* \* \*